(12) United States Patent
Webster

(10) Patent No.: US 9,825,073 B2
(45) Date of Patent: Nov. 21, 2017

(54) ENHANCED BACK SIDE ILLUMINATED NEAR INFRARED IMAGE SENSOR

(71) Applicant: OMNIVISION TECHNOLOGIES, INC., Santa Clara, CA (US)

(72) Inventor: Eric A. G. Webster, Mountain View, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 14/286,478

(22) Filed: May 23, 2014

(65) Prior Publication Data

US 2015/0340391 A1    Nov. 26, 2015

(51) Int. Cl.
*H01L 27/146* (2006.01)
*H04N 5/378* (2011.01)

(52) U.S. Cl.
CPC .... *H01L 27/14605* (2013.01); *H01L 27/1462* (2013.01); *H01L 27/1463* (2013.01);
(Continued)

(58) Field of Classification Search
CPC ............ H01L 25/167; H01L 27/14643; H01L 27/3227; H01L 31/02024; H01L 31/0203;
(Continued)

(56) References Cited

U.S. PATENT DOCUMENTS 5,028,138 A * 7/1991 Wolff ..................... G01B 11/24
356/364

6,150,188 A * 11/2000 Geusic ..................... G02B 6/43
257/E23.011
(Continued)

FOREIGN PATENT DOCUMENTS

TW        200812078 A      3/2008
TW        200947685 A1    11/2009
(Continued)

OTHER PUBLICATIONS

Tournier, A. et al., "Pixel-to-Pixel Isolation by Deep Trench Technology: Application to CMOS Image Sensor," Proc. IISW, 2011, pp. 12-15.
(Continued)

*Primary Examiner* — Cuong B Nguyen
*Assistant Examiner* — Samuel Park
(74) *Attorney, Agent, or Firm* — Christensen O'Connor Johnson Kindness PLLC

(57) ABSTRACT

An image sensor includes a photodiode disposed in semiconductor material to accumulate image charge in response to light directed through a back side of the semiconductor material. A scattering structure is disposed proximate to the front side of the semiconductor material such that the light that is directed into the semiconductor material through the back side is scattered back through the photodiode. A deep trench isolation structure is disposed in the semiconductor material that isolates the photodiode and defines an optical path such that the light that is scattered back through the photodiode in the optical path is totally internally reflected by the DTI. An antireflective coating is disposed on the back side of the semiconductor material and totally internally reflects the light scattered by the scattering structure to confine the light to remain in the optical path until it is absorbed.

23 Claims, 3 Drawing Sheets

(52) U.S. Cl.
CPC .... *H01L 27/1464* (2013.01); *H01L 27/14621* (2013.01); *H01L 27/14625* (2013.01); *H01L 27/14627* (2013.01); *H01L 27/14629* (2013.01); *H01L 27/14636* (2013.01); *H01L 27/14649* (2013.01); *H04N 5/378* (2013.01)

(58) Field of Classification Search
CPC ............... H01L 31/0284; H01L 31/1032; H01L 31/107
USPC ... 257/233, 292, 59, 72, 222, 225, 232, 234, 257/414, 432–466, 114, 293, E27.13, 257/E27.133, E33.076, E31.058, E31.063, 257/E31.115, E27.14, E27.15, E25.032, 257/440
See application file for complete search history.

(56) References Cited

U.S. PATENT DOCUMENTS

| | | | |
|---|---|---|---|
| 6,154,551 A * | 11/2000 | Frenkel | H04R 23/008 381/160 |
| 6,737,626 B1 | 5/2004 | Bidermann et al. | |
| 6,850,216 B2 * | 2/2005 | Akimoto | G09G 3/3648 345/547 |
| 7,262,402 B2 | 8/2007 | Niclass et al. | |
| 7,511,750 B2 | 3/2009 | Murakami | |
| 7,982,177 B2 | 7/2011 | Nozaki et al. | |
| 8,259,293 B2 | 9/2012 | Andreou et al. | |
| 8,535,807 B2 | 9/2013 | Kurihara | |
| 8,628,990 B1 | 1/2014 | Wu et al. | |
| 2004/0147068 A1 * | 7/2004 | Toyoda | H01L 27/1462 438/197 |
| 2004/0251395 A1 | 12/2004 | Takahashi et al. | |
| 2006/0192083 A1 | 8/2006 | Fu et al. | |
| 2007/0284686 A1 | 12/2007 | Liu et al. | |
| 2009/0200625 A1 * | 8/2009 | Venezia | H01L 27/1463 257/432 |
| 2009/0315135 A1 | 12/2009 | Finkelstein et al. | |
| 2010/0220226 A1 | 9/2010 | Wang et al. | |
| 2010/0285630 A1 * | 11/2010 | Lee | H01L 27/1462 438/70 |
| 2011/0266645 A1 * | 11/2011 | Chao | H01L 27/14603 257/432 |
| 2012/0313205 A1 * | 12/2012 | Haddad | H01L 31/02363 257/432 |
| 2012/0319242 A1 | 12/2012 | Mao et al. | |
| 2014/0077323 A1 * | 3/2014 | Velichko | H01L 27/14627 257/432 |
| 2014/0131779 A1 * | 5/2014 | Takeda | H01L 27/14689 257/292 |
| 2014/0132812 A1 * | 5/2014 | Soda | H01L 27/14629 348/302 |
| 2014/0197509 A1 * | 7/2014 | Haddad | H01L 27/14629 257/432 |
| 2014/0291481 A1 | 10/2014 | Zhang et al. | |
| 2014/0361347 A1 | 12/2014 | Kao | |
| 2016/0099371 A1 | 4/2016 | Webster | |

FOREIGN PATENT DOCUMENTS

| | | |
|---|---|---|
| TW | 201140128 A1 | 11/2011 |
| TW | 201301439 A1 | 1/2013 |
| TW | 201413924 A | 4/2014 |
| WO | WO 2012/032353 A2 | 3/2012 |

OTHER PUBLICATIONS

Shinohara, T. et al., "Three-dimensional Structures for High Saturation Signals and Crosstalk Suppression in 1.20 μm Pixel Back-Illuminated CMOS Image Sensor," Electron Devices Meeting (IEDM), 2013 IEEE International, pp. 27.4.1-27.4.4.

Ahn, J. et al., "A ¼-inch 8Mpixel CMOS Image Sensor with 3D Backside-Illuminated 1.12 μm Pixel with Front-Side Deep-Trench Isolation and Vertical Transfer Gate," ISSCC 2014: Session 7: Image Sensors: 7.1, 2014 IEEE International Solid-State Circuits Conference, Digest of Technical Papers, pp. 124-126.

"Optical Properties of Silicon" (n.d.), PVEducation, 4 pages. Retrieved May 23, 2014 from: http://pveducation.org/pvcdrom/materials/optical-properties-of-silicon.

"Total internal reflection" (n.d.), Wikipedia: the free encyclopedia, 7 pages. Retrieved May 23, 2014 from: http://en.wikipedia.org/wiki/Total_internal_reflection.

TW Patent Application No. 103135567—Taiwanese Office Action and Search Report, dated Jan. 20, 2016, with English Translation (11 pages).

TW Patent Application No. 104132615—Taiwanese Office Action, dated Jan. 23, 2017, with English Translation (5 pages).

TW Patent Application No. 104132615—Taiwanese Office Action and Search Report, dated Aug. 30, 2016, with English Translation (18 pages).

U.S. Appl. No. 14/506,144—Non-Final Office Action, dated Aug. 26, 2016, 11 pages.

U.S. Appl. No. 14/506,144—Final Office Action, dated Feb. 24, 2017, 8 pages.

PRC (China) Office Action dated Jun. 27, 2017, for Chinese Application No. 201410815014.9, filed Dec. 23, 2014, 15 pages.

* cited by examiner

ENHANCED BACK SIDE ILLUMINATED NEAR INFRARED IMAGE SENSOR

BACKGROUND INFORMATION

1. Field of the Disclosure

The present invention is generally related to image sensors, and more specifically, the present invention is directed to near infrared image sensors.

2. Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Two fields of applications in which size and image quality are particularly important are security and automotive applications. For these applications the image sensor chip must typically provide a high quality image in the visible light spectrum as well as have improved sensitivity in the infrared and near infrared portions of the light spectrum.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
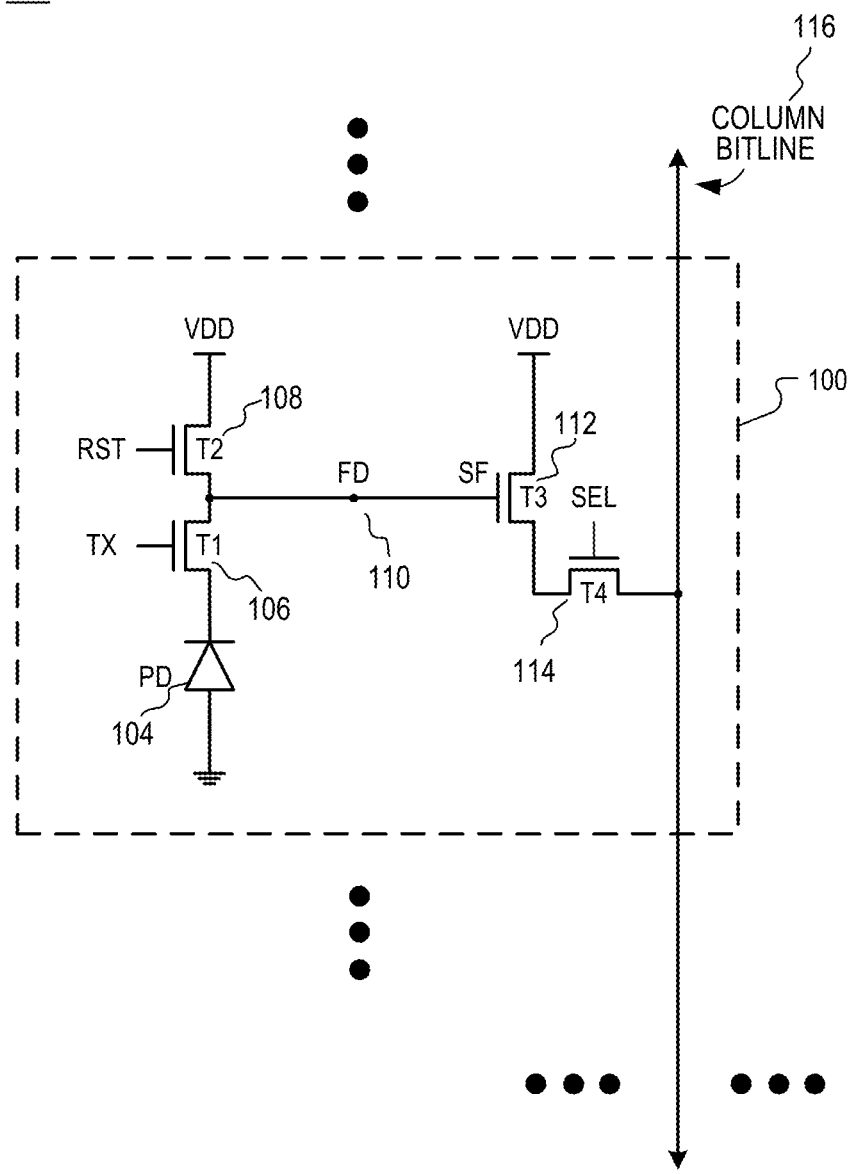
FIG. 1 is a schematic illustrating one example of pixel cell that may be included in an example enhanced back side illuminated near infrared image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In a typical back side illuminated (BSI) image sensor, infrared or near infrared light, such as for example light having a wavelength of approximately 850 nm, a majority of the incident light enters the back side of the semiconductor material, such as for example silicon, propagates through the semiconductor material, is reflected from the front side of the semiconductor material, and then exits back out the back side of the semiconductor material without being absorbed. Thus, thicker silicon is needed in order to absorb more of the incident infrared or near infrared light. However, the semiconductor material of a typical back side illuminated image sensor is typically thinned in order to improve visible light performance, which degrades infrared or near infrared performance of the image sensor.

Thus, as will be describe below, an example image sensor in accordance with the teaching of the present invention features deep trench isolation (DTI) structures combined with total internal reflection and scattering light from a diffuse reflector at the front side of the imaging sensor chip, which defines a light guide for infrared or near infrared light in the semiconductor material, which confines the near infrared light to remain within the semiconductor material until it is finally absorbed, which therefore improves infrared or near infrared sensitivity, as well as reduces optical crosstalk in an image sensor in accordance with the teachings of the present invention.

For instance, in one example, a photodiode is disposed proximate to a front side of a semiconductor material to accumulate image charge in response to near infrared light directed into the semiconductor material through a back side of the semiconductor material and through the photodiode. A scattering structure is disposed proximate to the front side of the semiconductor material, which causes the light that was not absorbed after a first pass through the photodiode to be scattered by the scattering structure and be directed back through the photodiode and the semiconductor material for multiple passes. Deep trench isolation (DTI) structures are disposed in the semiconductor material, which isolate the photodiode in the semiconductor material, as well as define an optical path in the semiconductor material including the photodiode. The light that is reflected at the front side of the semiconductor and scattered back through the photodiode in the optical path is totally internally reflected by the DTI structure, which confines the light to remain within the optical path. An antireflective coating is disposed on the back side of the semiconductor material such that the light that is directed into the semiconductor material through the back side of the semiconductor material is directed through the antireflective coating. The light that is reflected at the front side of the semiconductor that is scattered back through the photodiode in the optical path is also totally internally reflected by the antireflective coating, which confines the light to remain within the optical path until it is absorbed in the semiconductor material in accordance with the teachings of the present invention.

To illustrate, FIG. 1 is a schematic illustrating one example of pixel cell 100 that may be included in an example enhanced back side illuminated near infrared image sensor 102 in accordance with the teachings of the present invention. In the depicted example, pixel cell 100 is illustrated as being a four-transistor ("4T") pixel cell included in image sensor 102 in accordance with the teachings of the invention. It is appreciated that pixel cell 100 is one possible example of pixel circuitry architecture for implementing each pixel cell within the pixel array of image sensor 102 of FIG. 1. However, it should be appreciated that other examples in accordance with the teachings of the present invention are not necessarily limited to 4T pixel architectures. One having ordinary skill in the art having the benefit of the present disclosure will understand that the present teachings are also applicable to 3T designs, 5T designs, and various other pixel architectures in accordance with the teachings of the present invention.

In the example depicted in FIG. 1, pixel cell 100 includes a photodiode ("PD") 104 to accumulate image charge, a transfer transistor T1 106, a reset transistor T2 108, a floating diffusion ("FD") 110, a source-follower ("SF") transistor T3 112, and a select transistor T4 114. During operation, transfer transistor T1 106 receives a transfer signal TX, which transfers the image charge accumulated in photodiode PD 104 to floating diffusion FD 110. In one example, floating diffusion FD 110 may be coupled to a storage capacitor for temporarily storing image charges. In one example and as will be discussed in further detail below, one or more deep trench isolation (DTI) structures, a diffuse reflector, and an antireflective coating on the back side of the semiconductor material, are combined with total internal reflection and scattering light from the diffuse reflector to confine infrared or near infrared light within the semiconductor material until the light is absorbed in accordance with the teachings of the present invention. As such, improved infrared or near infrared sensitivity, as well as reduced optical crosstalk is provided in accordance with the teachings of the present invention. As shown in the illustrated example, reset transistor T2 108 is coupled between a power rail VDD and the floating diffusion FD 110 to reset the pixel cell 100 (e.g., discharge or charge the floating diffusion FD 110 and the photodiode PD 104 to a preset voltage) in response to a reset signal RST. The floating diffusion FD 110 is coupled to control the gate of SF transistor T3. SF transistor T3 is coupled between the power rail VDD and select transistor T4. SF transistor T3 operates as a source-follower amplifier providing a high impedance connection to the floating diffusion FD 110. Select transistor T4 114 selectively couples the output of pixel cell 100 to the readout column bitline 116 in response to a select signal SEL.

In one example, the TX signal, the RST signal, the SEL signal, and the readout pulse voltage, which is selectively coupled to the deep trench isolation, are generated by control circuitry, an example of which will be described in further detail below. In an example in which image sensor 102 operates with a global shutter, the global shutter signal is coupled to the gate of each transfer transistor T1 106 in the image sensor 102 to simultaneously commence charge transfer from each pixel's photodiode PD 104. Alternatively, rolling shutter signals may be applied to groups of transfer transistors T1 106 in accordance with the teachings of the present invention.

Figure 2:
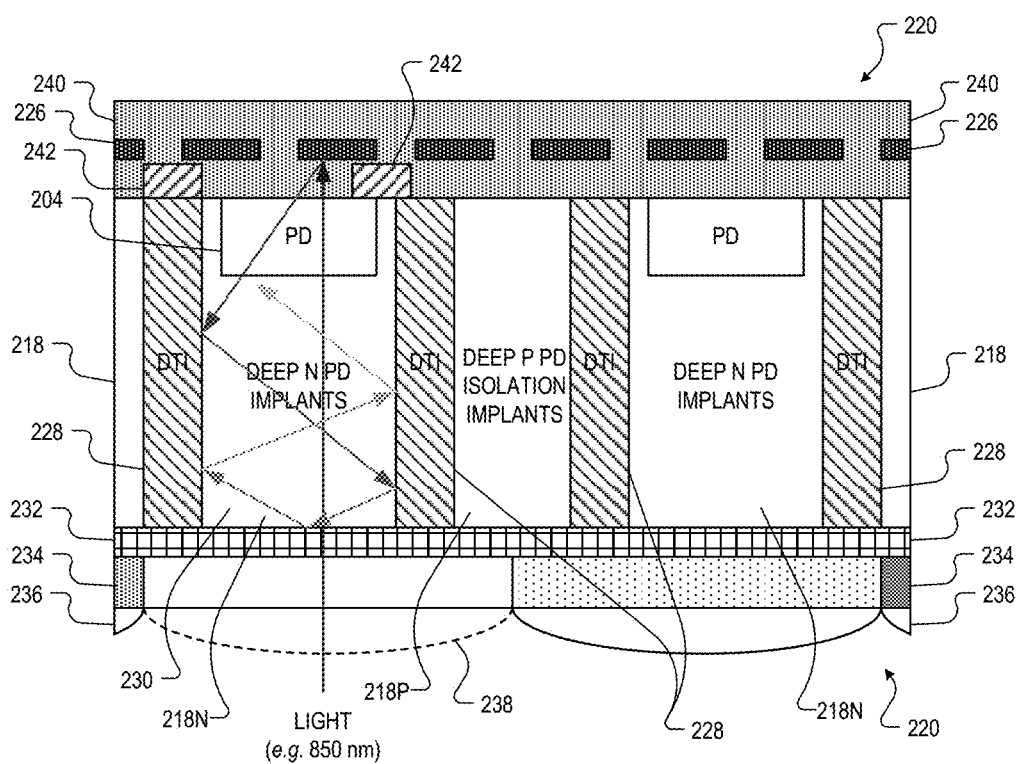
FIG. 2 is a cross-section view illustrating a cross-section view of a portion of one example of an example enhanced back side illuminated near infrared image sensor in accordance with the teachings of the present invention.

FIG. 2 is a cross-section view illustrating a cross-section view of a portion of one example of an example enhanced back side illuminated near infrared image sensor chip 202 in accordance with the teachings of the present invention. It is appreciated that image sensor chip 202 of FIG. 2 may be one example of an implementation of image sensor 102 of FIG. 1 and that similarly named and numbered elements referenced below are coupled and function similar to as described above. It is noted that other circuit elements of image sensor 102 shown in FIG. 1, such as for example the various transistors and associated diffusions and doped regions are not shown in detail in FIG. 2 so as not obscure the teachings of the present invention.

Referring back to the example illustrated FIG. 2, image sensor chip 202 includes a photodiode 204 disposed in a layer of semiconductor material 218 proximate to a front side 220 of the image sensor chip 202 to accumulate image charge in response to light 224, which is directed into the semiconductor material 218 through a back side 222 of the semiconductor material 218 and through the photodiode 204 as shown. In one example, semiconductor material 218 includes silicon, polysilicon, or another suitable semiconductor material. In one example, semiconductor material 218 is also thinned in order provide improved visible light performance of image sensor chip 202. In one example, light 224 includes infrared or near infrared light. For instance, in one example, light 224 may have a wavelength of approximately 850 nm.

As shown in the depicted example, image sensor chip 202 also includes deep trench isolation (DTI) structures 228 that are disposed in the semiconductor material 218, which isolate the photodiodes 204 in the semiconductor material 218, as well as define an optical waveguide or an optical path 230 for light 224 to propagate through the semiconductor material 218 to the photodiode 204 as shown in accordance with the teachings of the present invention. In one example, DTI structures 228 extend along a substantial portion of the optical path 230 through the semiconductor material 218 between the back side 222 of the semiconductor material 218 and the photodiode 204 in accordance with the teachings of the present invention. In one example, the DTI structures 228 are made of a material having a lower refractive index than the semiconductor material 218, such as for example an oxide material. In various examples, the DTI may also include of other materials that improve dark current performance in accordance with the teachings of the present invention. For example, hafnium oxide, tantalum oxide, and even an oxide liner including a poly fill with a negative bias may be included in DTI structures 228 in accordance with the teachings of the present invention.

In the example depicted in FIG. 2, the regions 218N of semiconductor material 218 between DTI structures 228 that include photodiodes 204 includes deep n photodiode implants. In other words, the regions 218N of semiconductor material 218 between DTI structures 228 that include photodiodes 204 includes deep photodiode implants having a first polarity of dopants. In that example, the regions 218P of semiconductor material 218 between DTI structures 228 that do not include photodiodes 204 include deep p photodiode isolation implants as shown. In other words, the regions 218P of semiconductor material 218 between DTI structures 228 that do not include photodiodes 204 include deep photodiode isolation implants having a second polarity of dopants. Thus, it is appreciated of course that the example shown in FIG. 2 is for explanation purposes, and that in other examples, the polarities of the dopants may be reversed in accordance with the teachings of the present invention. In other words, in other examples, the substrate polarities and NMOS/PMOS structures may be swapped in accordance with the teachings of the present invention.

Continuing with the example depicted in FIG. 2, a scattering structure 226 is disposed in a dielectric layer 240 proximate to the front side 220 of the image sensor chip 202 such that the light 224 that is directed into the semiconductor material 218 through the back side 222 of the semiconductor material 218 and through the photodiode 204 that is reflected at the front side 220 of the image sensor chip 202 is scattered by the scattering structure 226 back through the photodiode 204 back into optical path 230 in accordance with the teachings of the present invention. In one example, scattering structure 226 includes a diffraction grating or the like that is formed in a metal grid that is included in a metal layer in the dielectric layer 240 proximate to the front side 220 of image sensor chip 202. In various examples, the scattering structure 226 may include any suitable structure that is designed to scatter the light back at a non-normal incidence in accordance with the teachings of the present invention. As shown, the light 224 that is reflected at the front side 220 of the image sensor chip 202 is scattered back through the photodiode 204 in the optical path 230, and is then totally internally reflected by the DTI structures 228. As a result, the light 224 that is scattered with scattering structure 226 is therefore confined to remain in the semiconductor material 218 within the optical path 230 until the light 224 is absorbed in accordance with the teachings of the present invention.

Continuing with the example depicted in FIG. 2, an antireflective coating 232 is disposed on the back side 222 of the semiconductor material 218. Thus, light 224 is directed through antireflective coating 232 into the back side 222 of semiconductor material 218 as shown. However, as shown in the depicted example, the antireflective coating 232 also totally internally reflects the light 224 that is reflected at the front side 220 and scattered by scattering structure 226 back through the photodiode 204 in the optical path 230. As such, antireflective coating 232 further confines light 224 to remain in the semiconductor material 218 within the optical path 230 until the light 224 is absorbed in accordance with the teachings of the present invention. In one example, it is appreciated that the antireflective coating 232 that is above a near infrared pixel cell of the image sensor chip 202 is different from the antireflective coating above a visible light sensitive pixel cell of image sensor chip 202. In the example, the antireflective coating 232 is designed specifically to minimize reflection of incident near infrared light and maximize total internal reflection in accordance with the teachings of the present invention.

The example depicted in FIG. 2 also shows that image sensor chip 202 includes a color filter array (CFA) 234 disposed proximate to the antireflective coating 232, and an array of microlenses 236 disposed proximate to the color filter array 234 on the back side 222 of image sensor chip 202. In one example, color filter array 234 may include a combination of red, green, blue, and infrared or near infrared color filters that are arranged in a suitable pattern for image sensor chip 202. It is appreciated that other colors may also be included in other examples.

In one example, it is noted that there is no infrared or near infrared microlens disposed on the back side 222 to focus near infrared light 224 onto photodiode 204, which is shown in FIG. 2 with dashed line 238 indicating where a near infrared microlens would be disposed if it was included in color filter array 234. In one example, it is noted that the absence of microlens 238 in the array of microlenses 236 helps to increase the total internal reflection, and therefore reduce the escape of scattered light 224 from the optical path 230 in semiconductor material 218, which therefore increases the absorbance of light 224 in semiconductor material 218 to improve the modulation transfer function of image sensor chip 202 in accordance with the teachings of the present invention.

In one example, it is noted that lowly refractive, relative to dielectric layer 240, regions 242 may also be formed in dielectric layer 240 proximate to the DTI structures 228 as shown to further extend the optical path 230 into the dielectric layer 240 and improve crosstalk suppression in the dielectric layer 240 in accordance with the teachings of the present invention. In one example, highly refractive regions 242 may be formed by an etch or other suitable process.

Therefore, as shown in the depicted example, the scattering structure 226 scatters the light 224 that is reflected at the front side 220 of the semiconductor material 218 near a critical angle to achieve total internal reflection at the interfaces of the semiconductor material 218 with the DTI structures 228 and the antireflective coating 232. Thus, the light 224 is substantially confined to remain within the optical path 230 in the semiconductor material 218 until it is absorbed in accordance with the teachings of the present invention. Accordingly, it is appreciated that image sensor chip 202 not only has improved modulation transfer function performance for infrared or near infrared light 224 since substantially all of the light 224 is now absorbed, but image sensor chip 202 also has improved crosstalk performance since light 224 does not leak into neighboring pixels with the isolation provided with DTI structures 228 in accordance with the teachings of the present invention.

Figure 3:
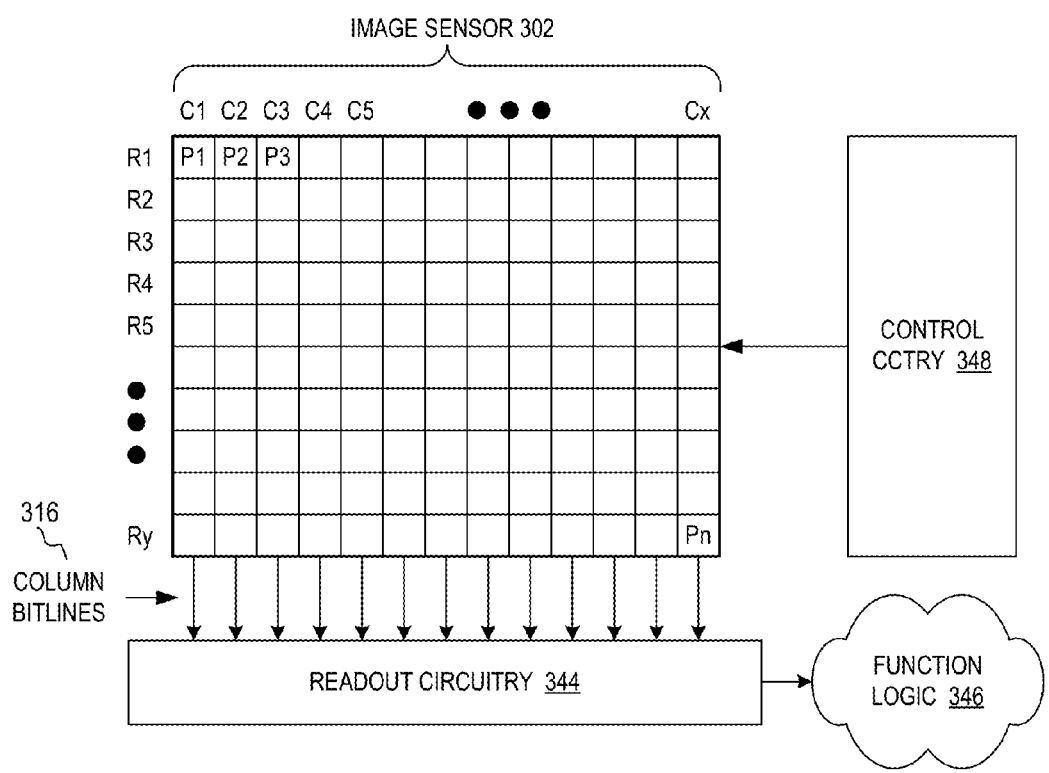
FIG. 3 is a diagram illustrating one example of an imaging system including an example enhanced back side illuminated near infrared image sensor including a pixel array in accordance with the teachings of the present invention.

FIG. 3 is a diagram illustrating one example of an imaging system 342 including an enhanced back side illuminated near infrared image sensor 302 in accordance with the teachings of the present invention. As shown in the depicted example, imaging system 342 includes image sensor 302 coupled to control circuitry 348 and readout circuitry 344, which is coupled to function logic 346.

In one example, image sensor 302 includes a pixel array that is a two-dimensional (2D) array of pixel cells (e.g., pixel cells P1, P2 . . . , Pn). In one example, each pixel cell is a CMOS imaging pixel. It is noted that the pixel cells P1, P2, . . . Pn in the pixel array 492 may be examples of pixel cell 100 of FIG. 1 and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell has accumulated its image data or image charge, the image data is readout by readout circuitry 344 through readout column bitlines 316 and then transferred to function logic 346. In various examples, readout circuitry 344 may include amplification circuitry, analog-to-digital (ADC) conversion circuitry, or otherwise. Function logic 346 may simply store the image data or even manipulate the image data by applying post image effects (e.g., crop, rotate, remove red eye, adjust brightness, adjust contrast, or otherwise). In one example, readout circuitry 344 may readout a row of image data at a time along readout column bitlines 316 (illustrated) or may readout the image data using a variety of other techniques (not illustrated), such as a serial readout or a full parallel readout of all pixels simultaneously.

In one example, control circuitry 348 is coupled to image sensor 302 to control operational characteristics of image sensor 302. For example, control circuitry 348 may generate a shutter signal for controlling image acquisition. In one example, the shutter signal is a global shutter signal for simultaneously enabling all pixels cells within image sensor 302 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
a first photodiode and a second photodiode disposed proximate to a front side of a semiconductor material to accumulate image charge in response to light directed into the semiconductor material through a back side of the semiconductor material and through the first and second photodiodes, respectively;
a diffraction grating disposed in a dielectric layer proximate to the front side of the semiconductor material such that the light that is directed into the semiconductor material through the back side of the semiconductor material and through the first and second photodiodes is substantially diffracted by the diffraction grating back at a non-normal incidence through the first and second photodiodes;
a first deep trench isolation (DTI) structure disposed in the semiconductor material to isolate the first photodiode in a first portion of the semiconductor material including a deep first implant having a first polarity, and to define a first optical path through the semiconductor material including the first photodiode and the diffraction grating, wherein the light is substantially diffracted by the diffraction grating in the first optical path back through the first photodiode in the first optical path, and is totally internally reflected by the first DTI structure to remain within the first optical path;
a second DTI structure disposed in the semiconductor material to isolate the second photodiode in the first portion of the semiconductor material including the deep first implant having the first polarity, and to define a second optical path through the semiconductor material including the second photodiode and the diffraction grating, wherein the light that is substantially diffracted by the diffraction grating in the second optical path back through the second photodiode in the second optical path, and is totally internally reflected by the second DTI structure to remain within the second optical path,
wherein a second portion of the semiconductor material includes a deep second implant having a second polarity, and wherein the deep second implant is disposed between the first DTI structure and the second DTI structure, and is in contact with the first DTI structure and the second DTI structure, and wherein the first portion of the semiconductor material does not include the deep second implant having the second polarity;
an antireflective coating disposed on the back side of the semiconductor material and covering the first photodiode, the second photodiode, first DTI structure, the second DTI structure, and the deep second implant, wherein the light that is directed into the semiconductor material through the back side of the semiconductor material is directed through the antireflective coating; and
lowly refractive regions disposed in dielectric layer, wherein the lowly refractive regions have a lower index of refraction than the dielectric layer and are vertically aligned with at least one of the first DTI structure or the second DTI structure to further extend at least one of the first optical path or the second optical path, respectively, into the dielectric layer to reflect near infrared light,
wherein, the first DTI structure and the second DTI structure include an oxide liner with a poly-silicon fill, wherein the oxide liner includes tantalum oxide to totally internally reflect light of 850 nm, and the poly-silicon fill is negatively biased.

2. The image sensor of claim 1 wherein the semiconductor material includes thinned silicon.

3. The image sensor of claim 1 wherein the first and second DTI structures include a material having a lower refractive index than the semiconductor material.

4. The image sensor of claim 1 wherein the first and second DTI structures extend along a substantial portion of the optical path through the semiconductor material between the back side of the semiconductor material and the photodiode.

5. The image sensor of claim 1 wherein the diffraction grating includes a metal grid disposed proximate to the front side of the semiconductor material.

6. The image sensor of claim 1 wherein the diffraction grating is disposed in a metal layer proximate to the front side of the semiconductor material.

7. The image sensor of claim 1 wherein the diffraction grating in the first and second optical paths is to diffract light back through the first and second photodiodes near a critical angle for total internal reflection at the first and second DTI structures.

8. The image sensor of claim 1 wherein the light includes the near infrared light.

9. The image sensor of claim 8 wherein there is no near infrared microlens disposed on the back side of the semiconductor material to focus the near infrared light onto the photodiode.

10. The image sensor of claim 1 wherein the antireflective coating above a near infrared pixel cell of the image sensor is different from the antireflective coating above a visible light sensitive pixel cell, and is designed specifically to minimize reflection of incident near infrared light and maximize total internal reflection.

11. An imaging system, comprising:
a pixel array having a plurality of pixel cells disposed in semiconductor material, wherein each one of the plurality of pixel cells includes:
a photodiode disposed proximate to a front side of the semiconductor material to accumulate image charge in response to light directed into the semiconductor material through a back side of the semiconductor material and through the photodiode;
a diffraction grating disposed in a dielectric layer proximate to the front side of the semiconductor material such that the light that is directed into the semiconductor material through the back side of the semiconductor material and through the photodiode is substantially diffracted by the diffraction grating back at a non-normal incidence through the photodiode; and
a deep trench isolation (DTI) structure disposed in the semiconductor material to isolate the photodiode in a first portion of the semiconductor material including a deep first implant having a first polarity, and to define an optical path through the semiconductor material including the photodiode and the diffraction grating, wherein the light is substantially diffracted by the diffraction grating in the optical path back through the photodiode in the optical path, and is totally internally reflected by the DTI to remain within the optical path,
wherein a second portion of the semiconductor material including a deep second implant having a second polarity is on an opposite side of the DTI structure and is in contact with the DTI structure, and the first portion of the semiconductor material does not include the deep second implant having the second polarity;
an antireflective coating disposed on the back side of the semiconductor material and covering the photodiode, the DTI structure, and the deep second implant, wherein the light that is directed into the semiconductor material through the back side of the semiconductor material is directed through the antireflective coating;
a lowly refractive region disposed in the dielectric layer, wherein the lowly refractive region has a lower index of refraction than the dielectric layer and is vertically aligned with the DTI structure to further extend the optical path into the dielectric layer;
control circuitry coupled to the pixel array to control operation of the pixel array; and
readout circuitry coupled to the pixel array to readout image data from the plurality of pixel cells,
wherein, the DTI structure includes an oxide liner with a poly-silicon fill, wherein the oxide liner includes tantalum oxide to totally internally reflect light of 850 nm, and the poly-silicon fill is negatively biased.

12. The imaging system of claim 11 further comprising function logic coupled to the readout circuitry to store the image data readout from the plurality of pixel cells.

13. The imaging system of claim 11 wherein the semiconductor material includes thinned silicon.

14. The imaging system of claim 11 wherein the DTI structure includes a material having a lower refractive index than the semiconductor material.

15. The imaging system of claim 11 wherein the DTI structure extends along a substantial portion of the optical path through the semiconductor material between the back side of the semiconductor material and the photodiode.

16. The imaging system of claim 13 wherein the diffraction grating includes a metal grid disposed proximate to the front side of the semiconductor material.

17. The imaging system of claim 13 wherein the diffraction grating is disposed in a metal layer proximate to the front side of the semiconductor material.

18. The imaging system of claim 13 wherein the diffraction grating in the optical path is to diffract light back through the photodiode near a critical angle for total internal reflection at the DTI structure.

19. The imaging system of claim 13 wherein the light includes near infrared light.

20. The imaging system of claim 19 wherein there is no near infrared microlens disposed on the back side of the semiconductor material to focus the near infrared light onto the photodiode.

21. The imaging system of claim 11, wherein the light that is substantially diffracted by the diffraction grating in the optical path back through the photodiode in the optical path is totally internally reflected by the antireflective coating to remain within the optical path.

22. The image sensor of claim 1, wherein the light that is substantially diffracted by the diffraction grating in the first and second optical paths back through the first and second photodiodes in the first and second optical paths is totally internally reflected by the antireflective coating to remain within the first and second optical paths.

23. The imaging system of claim 21 wherein the antireflective coating above a near infrared pixel cell of the pixel array is different from the antireflective coating above a visible light sensitive pixel cell, and is designed specifically to minimize reflection of incident near infrared light and maximize total internal reflection.

* * * * *

UNITED STATES PATENT AND TRADEMARK OFFICE
CERTIFICATE OF CORRECTION

PATENT NO.         : 9,825,073 B2
APPLICATION NO.    : 14/286478
DATED              : November 21, 2017
INVENTOR(S)        : E. A. G. Webster Page 1 of 1

It is certified that error appears in the above-identified patent and that said Letters Patent is hereby corrected as shown below:

In the Claims

| Column | Line | Error |
| --- | --- | --- |
| 10 (Claim 16, Line 1) | 17 | "claim 13" should read --claim 11-- |
| 10 (Claim 17, Line 1) | 20 | "claim 13" should read --claim 11-- |
| 10 (Claim 18, Line 1) | 23 | "claim 13" should read --claim 11-- |
| 10 (Claim 19, Line 1) | 27 | "claim 13" should read --claim 11-- |

Signed and Sealed this
Eighth Day of May, 2018

Andrei Iancu
*Director of the United States Patent and Trademark Office*